United States Patent [19]
Hashimoto

[11] Patent Number: 5,796,749
[45] Date of Patent: Aug. 18, 1998

[54] DELAY CORRECTION CIRCUIT FOR SEMICONDUCTOR TESTER

[75] Inventor: Shinichi Hashimoto, Saitama, Japan

[73] Assignee: Advantest Corp., Tokyo, Japan

[21] Appl. No.: 776,835

[22] PCT Filed: Aug. 31, 1995

[86] PCT No.: PCT/JP95/01733

§ 371 Date: Apr. 25, 1997

§ 102(e) Date: Apr. 25, 1997

[87] PCT Pub. No.: WO97/08563

PCT Pub. Date: Mar. 6, 1997

[51] Int. Cl.$^6$ ............................................. G06F 11/00
[52] U.S. Cl. ................................................. 371/22.1
[58] Field of Search ............................ 371/22.1, 22.5, 371/22.6, 27.3, 27.7; 365/230, 189.11

[56] References Cited

U.S. PATENT DOCUMENTS

| | | | |
|---|---|---|---|
| 5,544,105 | 8/1996 | Hirose et al. | 365/189.11 |
| 5,629,900 | 5/1997 | Hirose et al. | 365/230 |

FOREIGN PATENT DOCUMENTS 3-80267  12/1991  Japan.

*Primary Examiner*—Vincent P. Canney
*Attorney, Agent, or Firm*—Muramatsu & Associates

[57] ABSTRACT

The present invention is to provide a delay correction circuit for a semiconductor tester which can decrease a circuit size and electric power consumption in a timing correction part. To achieve this goal, a variable delay element which corrects the phase difference stemming from the common parts of test stations is provided at an output of a waveform controller. At an output of a waveform output controller which generates the signal determining whether a signal should be applied to the test stations, flip-flops are provided which perform an inter-leave function. A gate circuit is provided which combines each unit of the inter-leave function based on the output signal of the variable delay element. An AND gate is provided which takes the logical AND between the output of the gate circuit corresponding to the test station and the output of the variable delay element. A variable delay element which corrects the phase difference stemming from each test station is provided at the output of the AND gate.

4 Claims, 4 Drawing Sheets

1

DELAY CORRECTION CIRCUIT FOR SEMICONDUCTOR TESTER

TECHNICAL FIELD

This invention relates to a delay correction circuit for a semiconductor device tester to correct the timings of signals applied to semiconductor devices under test and to establish a phase relationship between the signals when a plurality of test stations for are provided to test the semiconductor devices under test simultaneously by the semiconductor device tester.

BACKGROUND ART

Generally, a plurality of test stations are used to test and process many semiconductor devices to be tested efficiently in a semiconductor tester. The devices to be tested are electrically connected to the test stations through IC sockets, and the device test proceeds simultaneously for each semiconductor device under test. Waveforms of test signals for each device under test must be applied in the same condition. Hence, the semiconductor tester is so composed as to include a timing correction circuit for each test station to correct the differences between the timings of the test signals and synchronizes the phase of the test signals at each device terminal to be tested.

FIG. 3 shows an example of a delay correction circuit in a conventional semiconductor tester. A timing correction part 10 is provided for each pin of the device to be tested as designated by #1, #2, . . . #n. An output signal of a corresponding pin of the device is taken out as an output signal 61 for a test station 1 and an output signal 62 of another device is taken out for a test station 2. The wave form to be provided to the test station 1 (21) and to the test station 2 (22) is generated by a waveform controller 11. A signal for determining whether this waveform should be provided through a driver terminal to the device is generated by a waveform output controller 12. Waveform output control signals 51 and 52 for corresponding test stations are adjusted in the timing at a flip-flop 13 by a timing clock 50, and are taken out as signals 53 and 54. A logical AND is established between a signal from the waveform controller 11 and the signal 53 from the flip-flop 13 by an AND gate 14 to produce a signal for the test station 1. Similarly, a logical AND is established between the signal from the waveform controller 11 and the signal 54 from the flip-flop 13 by an AND gate 15 to produce a signal for the test station 2. The flip-flop noted above may be a edge type flip-flop or a latch type flip-flop.

In general, the waveforms generated by the waveform controller 11 differ their phases with respect to each pin of the device under test. This is because the phase differences are caused by the complexity of waveforms provided to the device to be tested, which in turn necessitates the waveform controller 11 to have a large number of gate circuits, thereby vary the accumulated propagation delay times of the gate circuits for the corresponding pins of the device. Hence, variable delay elements (16, 17) are provided at the timing correction part 10 so as to correct this phase differences between the pins. In addition, the small differences of the delay times occur between the test station 1 and the test station 2. This is mainly caused by the difference in the cable lengths used in the test stations. Hence, the variable delay elements are provided at each test station as well. A variable delay element 16 for the test station 1 covers both of the two kinds of delay times noted above. A variable delay element 17 for the test station 2 covers both of the other two kinds of delay times noted above.

2

Assuming an adjustable range stemming from the delay time difference for the test station 1 as A1, an adjustable range stemming from the delay time difference of the test station 2 as A2, and an adjustable range stemming from the delay time difference of the waveform controller as B. Then an adjustable range S1 to be covered by the variable delay element 16 for the test station 1 is represented as:

$$S1 = A1 + B$$

And an adjustable range S2 to be covered by the variable delay element 17 for the test station 2 is represented as:

$$S2 = A2 + B$$

Hence, each variable delay element is composed of the sum of the delay times in the timing correction part common to all the test stations and in the timing correction part independent for each test station.

FIG. 4 is a timing chart for explaining the operation of the conventional delay time correction circuit. An output of the waveform controller 11 at the timing correction part #1 is in a position behind the timing clock 50 by a time T15. On the other hand, an output of the waveform controller 11 at the timing correction part #n is delayed by a time T25 from the timing clock 50.

The output 61 of the delay element 16 at the timing correction part #1 is adjusted to a timing T13 to take into consideration of a delay time T11 in the test station 1 so as to generate the waveform as shown in FIG. 4 at the terminal 71 of the test station 1. Next, the output 62 of the delay element 17 at the timing correction part (#1) is adjusted to a timing T14 to take into consideration of the delay time of a delay time T12 in the test station 2 so as to generate the wave form as shown in FIG. 4 at the terminal 72 of the station 2 with exactly the same phase as the terminal 71.

Similarly, the output 61 of the delay element 16 at the timing correction part #n is adjusted to a timing T23 to take into consideration of a delay time T21 in the test station 1 so as to generate the waveform shown in FIG. 4 at the terminal 73 of the test station 1. Next, the output 62 of the delay element 17 at the timing correction part #n is adjusted to a timing T24 to take into consideration of a delay time T22 in the test station 2 so as to generate the waveform at the terminal 74 of the test station 2 with exactly the same phase as that of the terminal 73 of the test station 1.

In the foregoing example, the timing value in the common correction part (the difference between timings T15 and T25) accounts for the significant portion of the delay time to be adjusted, while delay times (T11, T12, T21, T22) in the correction part at each test station occupies a small portion of the delay time. Accordingly, the delay time correction circuit in the timing correction circuit 10 requires a circuit size which is about twice as large as that required in the common correction part. Hence the conventional technology requires a large circuit size and thus a large electric consumption.

Therefore, It is an object of the present invention to solve the above noted problems in the conventional delay correction circuit of the semiconductor tester. It is a further object of the present invention to provide a delay correction circuit for a semiconductor tester whose timing correction part is composed of a correction circuit which is common to all the test stations and an independent correction circuit for each test station to decrease the circuit size and the power consumption.

DISCLOSURE OF THE INVENTION

In the timing correction circuit of the present invention for the semiconductor device tester having a plurality of test stations for mounting the semiconductor devices to be tested, a variable delay element which corrects the phase difference stemming from a common part of the test stations is provided at an output side of a waveform controller which generates waveform signals. Flip-flop circuits which performs inter-leave functions by a waveform control signal are provided at an output side of a waveform output controller which generates a signal for determining whether the waveform signals be applied to the corresponding test station. Gate circuits are provided which combines each element of the inter-leave functions by the output signal of the variable delay element. Further, an AND gate is provided which takes the logical product between an output signal of the gate circuit for each test station and an output signal for the variable delay element. Variable delay elements are further provided which correct phase differences stemming from each test station at the output of the AND gate. The delay correction circuit of the present invention for the semiconductor tester is configured as mentioned above for all the test stations.

According to this invention, each waveform to be applied to the semiconductor device under test is combined after the wave control signal is inter-leaved by the output signal of the waveform controller and has passed the common correction circuit having the variable delay element. Then the phase differences in the waveform stemming from each station are corrected by the variable delay element in each test station. Hence, concerning the circuit size of the timing correction part, the common correction circuits do not need to be as many as the number of the stations, but only one common correction circuit is sufficient. Hence the circuit size is greatly decreased.

BEST MODE FOR CARRYING OUT THE INVENTION

Figure 1:
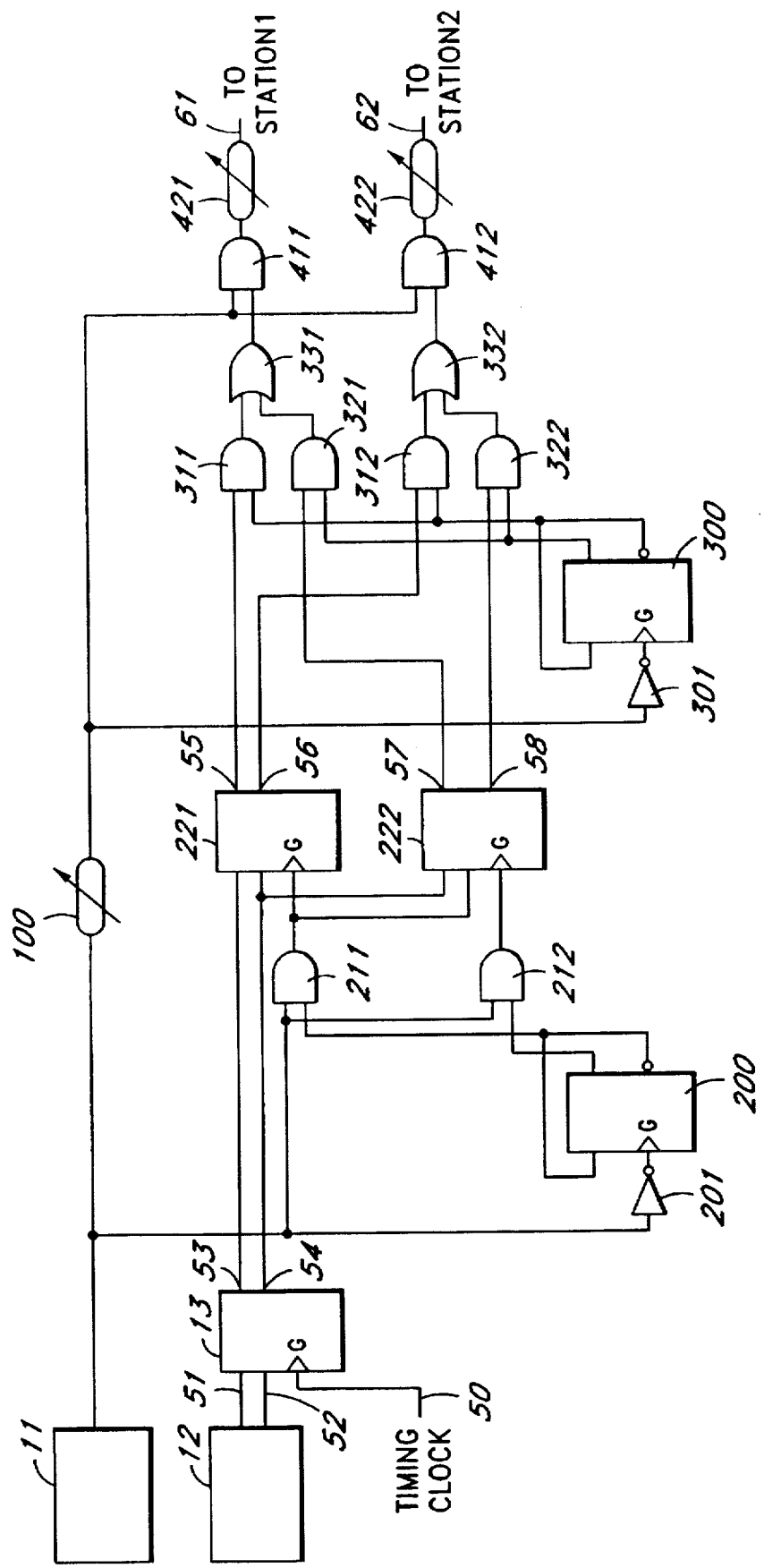
FIG. 1 is a block diagram showing the embodiment of the present invention.

An embodiment of the present invention is explained in the following with reference to the drawings. FIG. 1 is a block diagram showing an embodiment of the present invention. As shown in FIG. 1, the outputs (53, 54), which are provided from a waveform output controller 12 are synchronized with each other by a the flip-flop 13. The outputs 53 and 54 are latched by flip-flops (221, 222) using a waveform generation clock from a waveform controller 11. In this example, two latches are used to perform a two phase inter-leave function.

A flip-flop 200 outputs two signals which alternately change the state for every input of the clock signal. At gates 211 and 212, the output clock from the waveform controller 11 is selected based on the state of the output signal from the flip-flop 200, and the selected signal is provided to a flip-flop 221 and a flip-flop 222 as a clock signal. The flip flops 221 and 222 alternately latch and hold the input data.

The signal from the waveform controller 11 is delayed by a variable delay element 100. The amount of the adjustable delay time of the variable delay element 100 is determined to a value sufficient to cover the time differences in the correction factors common to all the test stations. Thus, the adjustable delay time corresponds to the aforementioned adjustable range B derived from the delay time difference of the waveform controller. The data held by the flip-flop (221, 222) is maintained even after the delay time determined by the variable delay element 100. In the end, waveforms to be provided for each test station are combined by gate circuits 411 and 412. A flip-flop 300 generates two output signals which alternately change the state corresponding to the two phase inter-leave function. Based on the output signals of the flip-flop 300, a first phase signal is selected by a gate circuit 311, and a second phase signal is selected by a gate circuit 321, and a logical sum of both of the selected phase signals is produced by an OR gate 331 as a waveform control signal for the test station 1. Similarly, a first phase signal is selected by a gate circuit 312, a second phase signal is selected by a gate circuit 322, and a logical sum of both of the selected phase signals is produced by an OR gate 332 as a waveform control signal for the test station 2.

The output signal of the gate circuit 411 is provided to the test station 1 through a variable delay element 421. The adjustable range of this variable delay element 421 is determined to be sufficient to cover the delay time differences in the test station 1. This range corresponds to the adjustable range A1 described above. Similarly, the output signal of the gate circuit 412 is provided to the test station 2 through a variable delay element 422. The adjustable range of this variable delay element 422 is determined to be sufficient to cover the delay time differences in the test station 2. This range corresponds to the adjustable range A2 described above.

Figure 2:
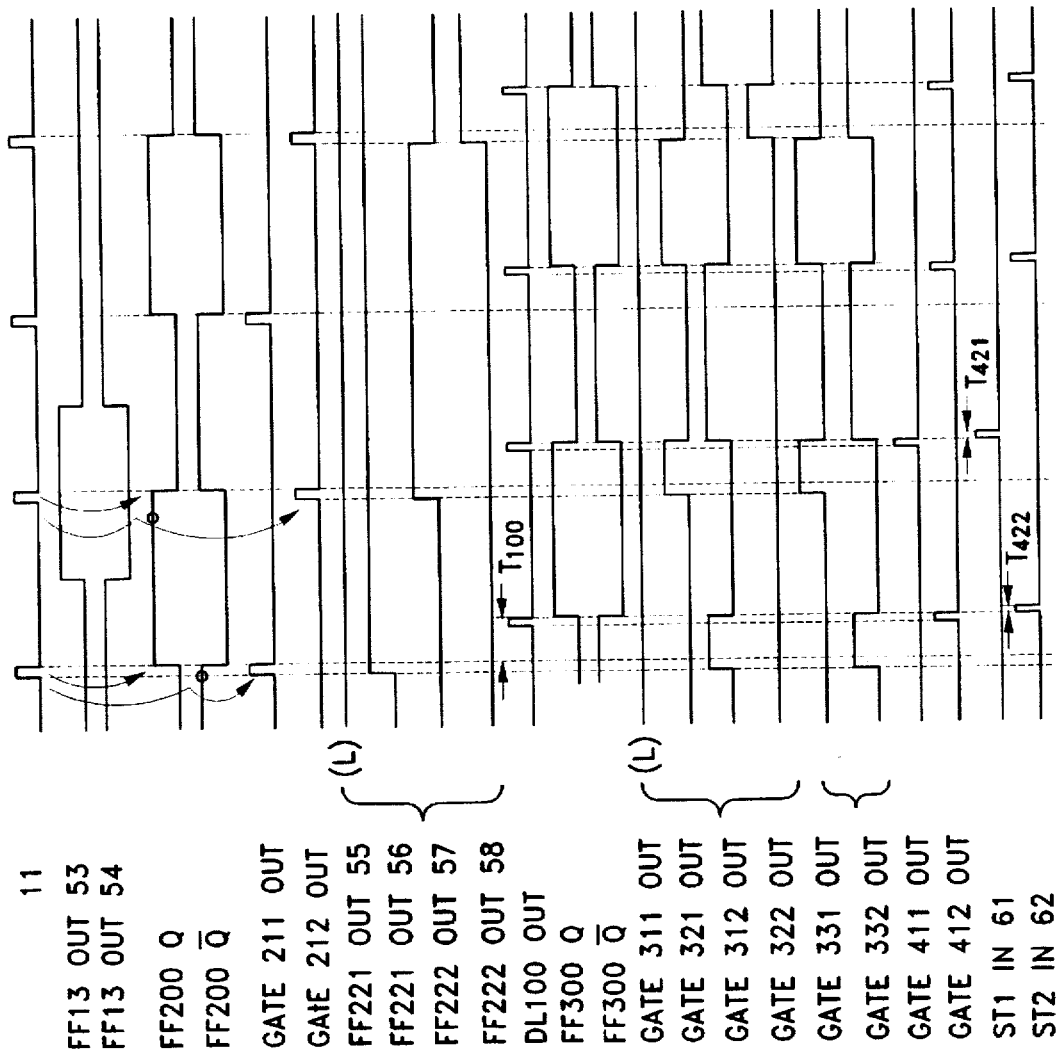
FIG. 2 is a time chart showing the operation of the timing correction part of the present invention.
Figure 3:
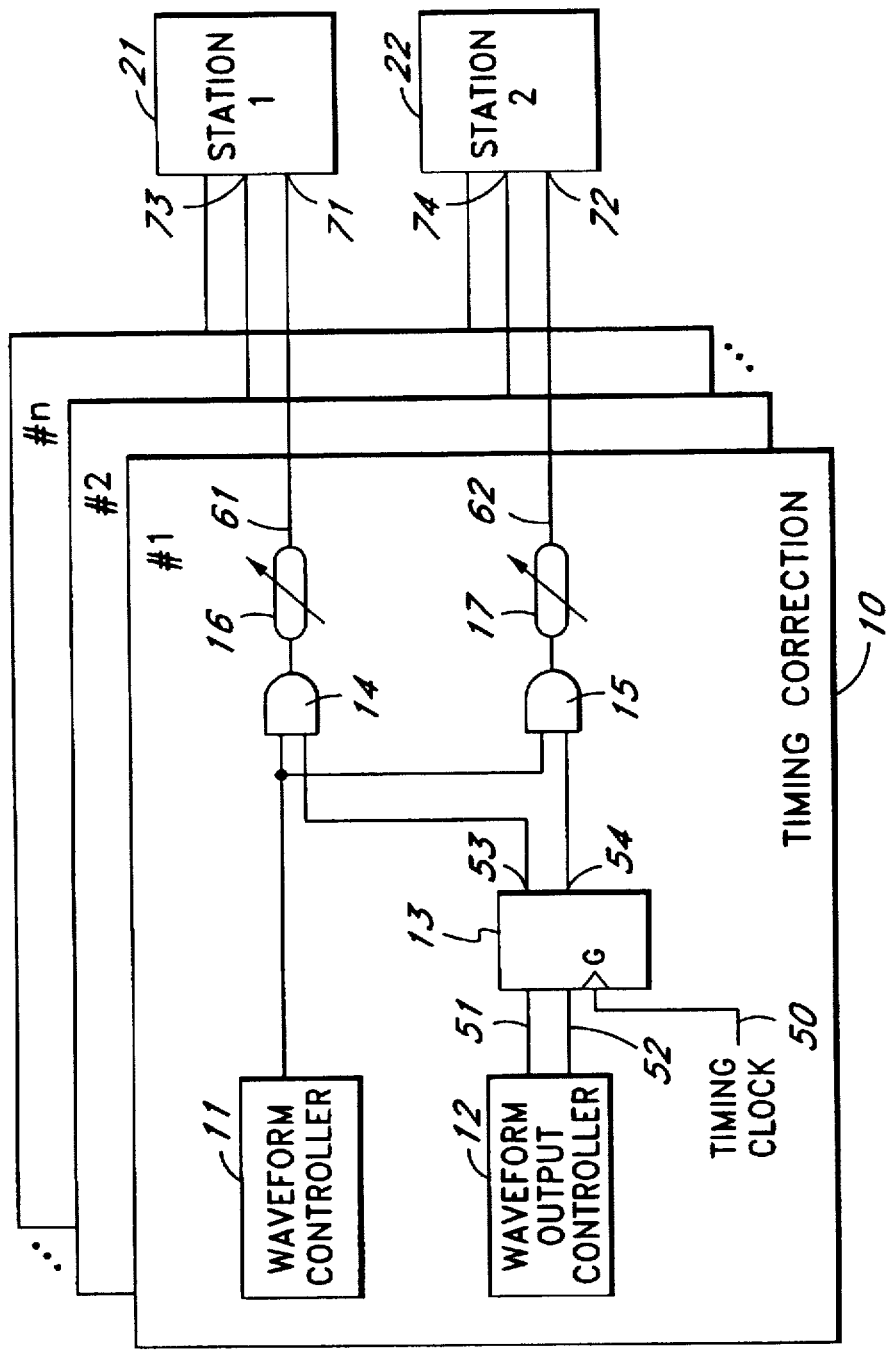
FIG. 3 shows an example of a conventional delay correction circuit in a semiconductor tester.
Figure 4:
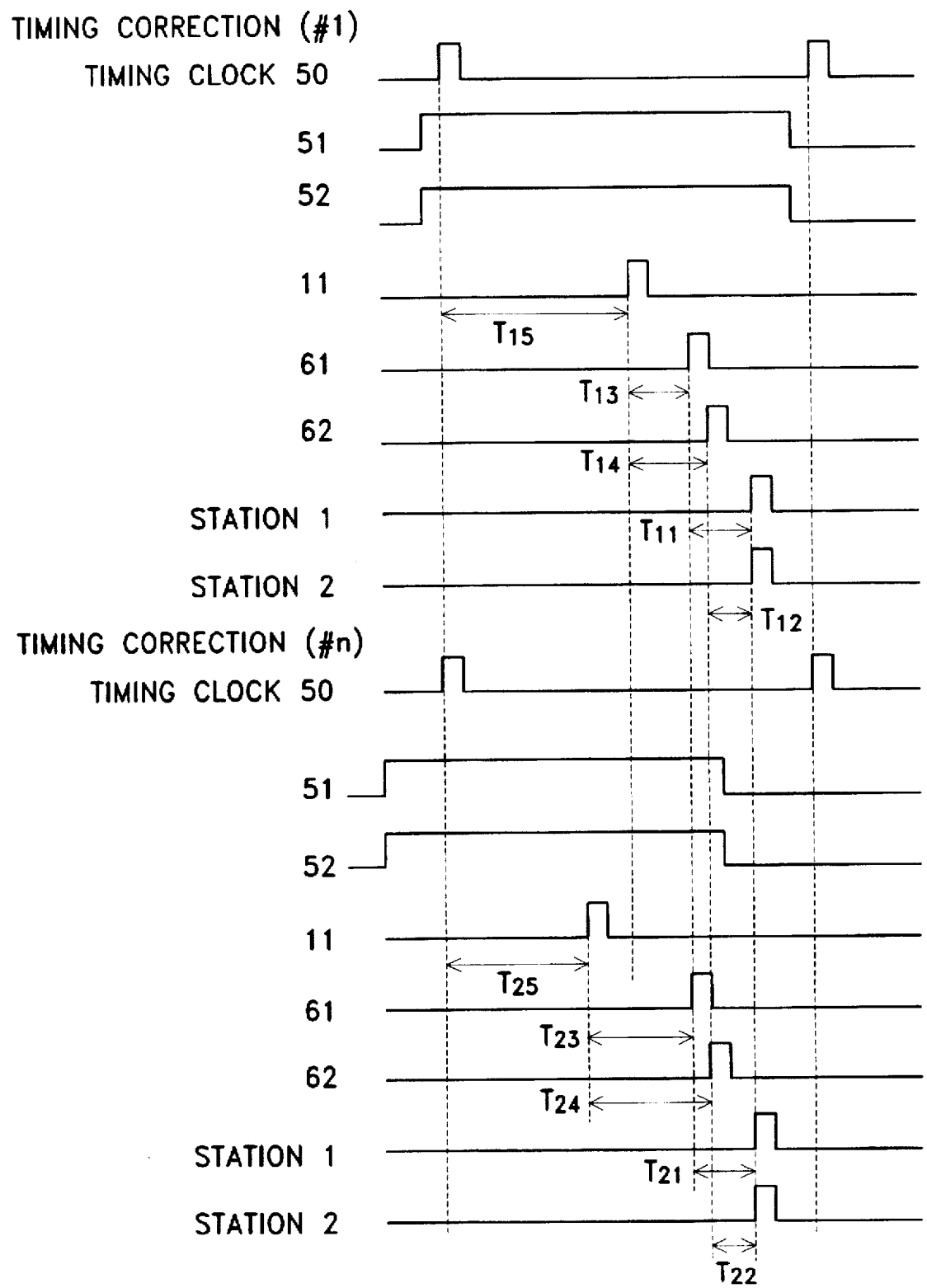
FIG. 4 is a timing chart for explaining the operation of the conventional delay correction circuit.

FIG. 2 is a timing chart showing the operation of the timing correction part of the present invention. In FIG. 2, the delay time by the variable delay element 100 is represented as T100. The delay time of the output 61 by the variable delay element 421 for the test station 1 is represented as T421. The delay time of the output 62 by the variable delay element 422 for the test station 2 is represented as T422.

Since the adjustable delay amount of each variable delay element (100, 421, 422) is determined as described above, the adjustable range of the variable delay element 421 can be small to correct only the time difference stemming from the test station 1. The adjustable range of the variable delay element 422 can be small to correct only the time difference stemming from the test station 2. The variable delay element 100 is a common correction circuit and is required to have a large adjustable rage to correct the time difference stemming in the waveform controller. However, in the timing correction part 10, only one such variable delay element is needed. Therefore, when the comparison is made, a circuit scale SS of the conventional timing correction circuit is represented as;

$$SS=(A1+B)+(A1+B)=A1+A2+2B$$

while a circuit scale SS of the present invention is represented as;

$$SS=A1+A2+B$$

Thus, it is possible to greatly reduce the circuit scale. Even when the number of the station is arbitrarily assigned as n, only one common correction circuit is sufficient, thereby minimizing the circuit scale.

The embodiment described above is composed of the two phase inter-leave function. Generally, the number of the latch circuits is determined by the relationship between the minimum spacing between the clock signal generated by the waveform controller and the maximum delay amount of the variable delay element 100. Thus, the number of the flip-flops (221, 222) for the latch circuits can be increased to compose a multi-phase inter-leave function.

INDUSTRIAL APPLICABILITY

Since it is configured as described in the foregoing, the present invention has the following effects. In the delay correction circuit for a semiconductor tester, the timing correction part, which has been conventionally provided in each of the test stations, is now composed of a combination of a common correction circuit and a correction circuit for the corresponding test station. Thus, the delay correction circuit of the invention is possible to decrease the circuit size and the electric consumption.

What is claimed is:

1. A delay correction circuit for a semiconductor tester having a plurality of test stations for mounting semiconductor devices to be tested thereon, characterized in having:

a variable delay element (100) provided at an output side of a waveform controller (11);

flip-flops (200, 221, 222) provided at an output of a waveform output controller (12) for performing an inter-leave function based on a waveform control signal from the waveform output controller;

gate circuits (311, 321, 331, 312, 322, 332) which combine elements of the inter-leave functions based on output signals from the variable delay element (100); and an AND gate (411) which produces a logical AND between an output of the gate circuit (331) corresponding to the test station n and an output of the variable delay element (100).

2. A delay correction circuit for a semiconductor tester of claim 1 characterized in minimizing a circuit size for all of the test stations by providing an variable delay elements (421, 422) at outputs of the AND gates (411, 412) for the test station n.

3. A delay correction circuit for a semiconductor tester of claim 1 or 2 characterized in having:

a flip-flop (200) which alternately outputs m states for every clock from the waveform controller (11);

a gate circuit (211, 212) which selects a clock signal from the waveform controller (11) based on the m states; and flip-flops (221, 222) which latch the signal from the waveform output controller (12) by the selected outputs of the gate circuit (211, 212).

4. A delay correction circuit for a semiconductor tester of claim 1 or 2, wherein the gate circuit having each unit of the inter-leave function characterized in having:

a flip-flop (300) which alternately outputs m states for every clock from the variable delay element (100);

a gate circuit (311, 321, 312, 322) which selects each output signal from the flip-flop (221,222) based on the m states; and an OR gate (331) which outputs a logical sum of the outputs of the gate circuit (311, 321).

* * * * *